United States Patent
Yamamura et al.

(10) Patent No.: US 8,564,087 B2
(45) Date of Patent: Oct. 22, 2013

(54) PHOTODIODE MANUFACTURING METHOD AND PHOTODIODES

(75) Inventors: Kazuhisa Yamamura, Hamamatsu (JP); Akira Sakamoto, Hamamatsu (JP); Terumasa Nagano, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 264 days.

(21) Appl. No.: 13/148,091

(22) PCT Filed: Feb. 15, 2010

(86) PCT No.: PCT/JP2010/052205
§ 371 (c)(1),
(2), (4) Date: Aug. 5, 2011

(87) PCT Pub. No.: WO2010/098222
PCT Pub. Date: Sep. 2, 2010

(65) Prior Publication Data
US 2011/0291213 A1    Dec. 1, 2011

(30) Foreign Application Priority Data
Feb. 25, 2009    (JP) .................................. 2009-042352

(51) Int. Cl.
*H01L 31/00* (2006.01)
*H01L 29/06* (2006.01)
*H01L 21/00* (2006.01)

(52) U.S. Cl.
USPC ............. 257/460; 257/432; 257/623; 438/71; 438/98; 438/459

(58) Field of Classification Search
None
See application file for complete search history.

(56) References Cited

U.S. PATENT DOCUMENTS

| | | | | |
|---|---|---|---|---|
| 4,277,793 A * | 7/1981 | Webb | ............................. | 257/436 |
| 5,763,903 A * | 6/1998 | Mandai et al. | ................. | 257/186 |
| 6,127,623 A * | 10/2000 | Nakamura et al. | ............. | 136/256 |
| 7,442,629 B2 * | 10/2008 | Mazur et al. | ................... | 438/487 |
| 7,888,766 B2 * | 2/2011 | Shibayama | ................... | 257/466 |
| 8,101,856 B2 * | 1/2012 | Hovel | ............................. | 136/261 |
| 2006/0130891 A1 * | 6/2006 | Carlson | .......................... | 136/256 |

(Continued)

FOREIGN PATENT DOCUMENTS

| | | |
|---|---|---|
| JP | 50-147230 | 11/1975 |
| JP | 59-224183 | 12/1984 |
| JP | 61-182272 | 8/1986 |
| JP | 62-18075 | 1/1987 |
| JP | 3-253081 | 11/1991 |
| JP | 7-235658 | 9/1995 |
| JP | 8-111542 | 4/1996 |
| JP | 2000-299489 | 10/2000 |
| JP | 2005-45073 | 2/2005 |
| JP | 2007-207990 | 8/2007 |
| JP | 2008-515196 | 5/2008 |
| JP | 2008-153311 | 7/2008 |

*Primary Examiner* — Evan Pert
*Assistant Examiner* — Andres Munoz
(74) *Attorney, Agent, or Firm* — Drinker Biddle & Reath LLP

(57) ABSTRACT

A semiconductor substrate 2 is dry etched before an insulating layer 4 is exposed, whereby a hole H1 penetrating through the semiconductor substrate 2 and reaching the insulating layer 4 is formed at a position corresponding to a photosensitive region S1. Next, an irregular asperity 22 is formed in a surface 7 of an $n^+$ type embedded layer 6 exposed in the hole H1. The surface of the $n^+$ type embedded layer 6 exposed in the hole H1 through the insulating layer 4 is irradiated with a picosecond to femtosecond pulsed laser beam, whereby the insulating layer 4 is removed and the surface 7 of the $n^+$ type embedded layer 6 exposed in the hole H1 is roughened by the picosecond to femtosecond pulsed laser beam, to form the irregular asperity 22 in the entire area of the surface 7. Then the substrate with the irregular asperity 22 therein is subjected to a thermal treatment.

7 Claims, 13 Drawing Sheets

(56) References Cited

U.S. PATENT DOCUMENTS

| | | | |
|---|---|---|---|
| 2006/0278898 A1* | 12/2006 | Shibayama | 257/228 |
| 2009/0101197 A1* | 4/2009 | Morikawa | 136/252 |
| 2010/0136735 A1* | 6/2010 | Arai | 438/72 |
| 2012/0146172 A1* | 6/2012 | Carey et al. | 257/443 |
| 2012/0264252 A1* | 10/2012 | Ko et al. | 438/72 |

* cited by examiner

Fig.7
(a)
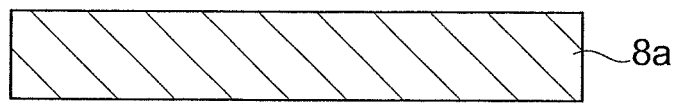
(b)
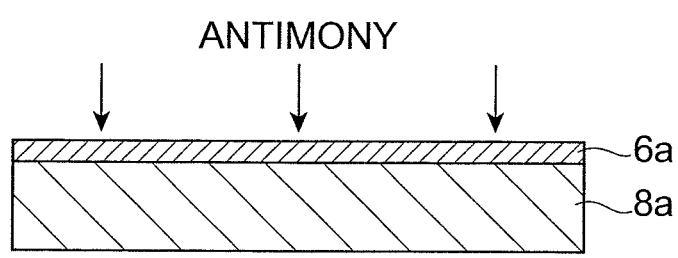
(c)
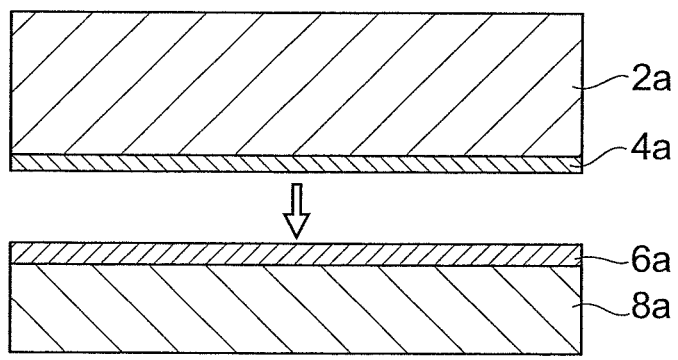
(d)
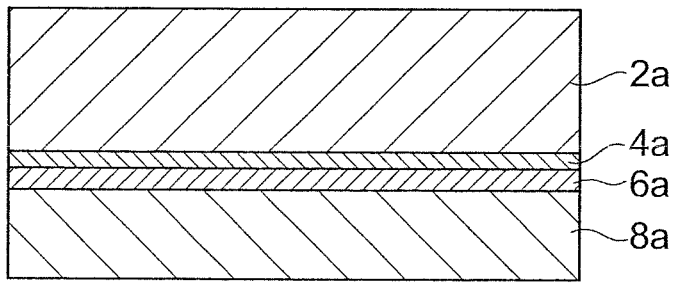

Fig.12
(a)
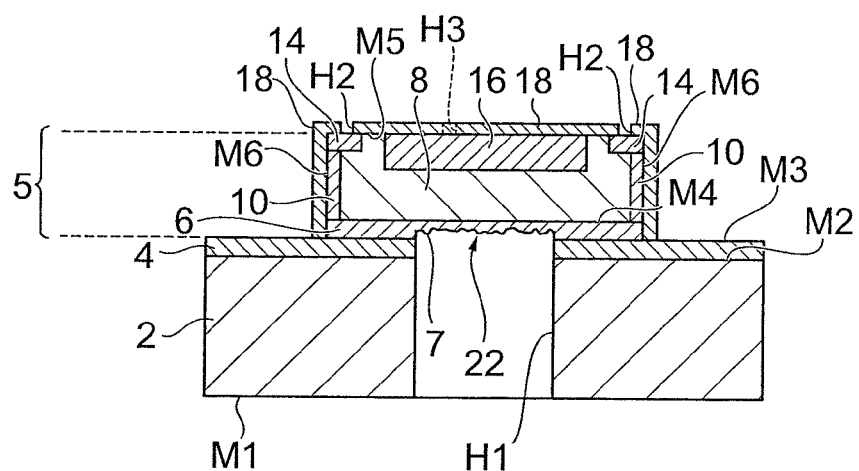
(b)
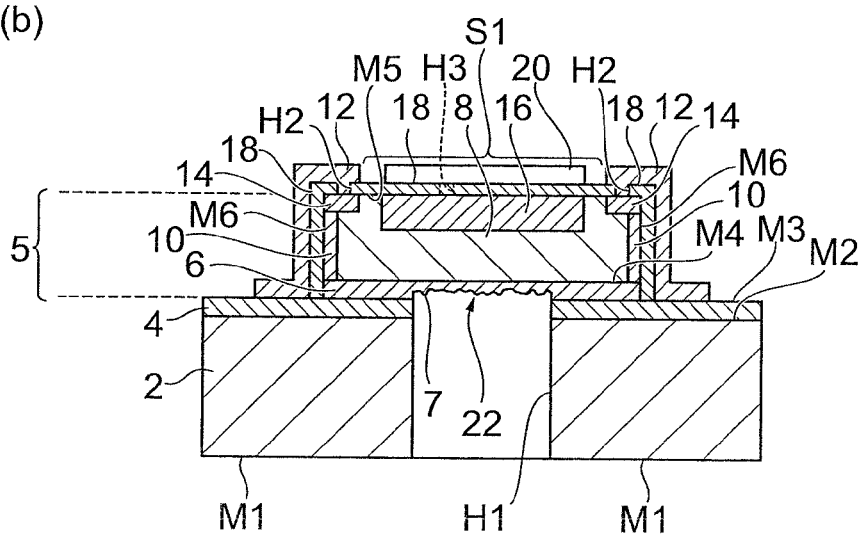

PHOTODIODE MANUFACTURING METHOD AND PHOTODIODES

TECHNICAL FIELD

The present invention relates to a photodiode manufacturing method and photodiodes.

BACKGROUND ART

A photodiode using compound semiconductors is known as a photodiode with a high spectral sensitivity characteristic in the near-infrared wavelength band (e.g., cf. Patent Literature 1). The photodiode described in Patent Literature 1 is provided with a first light receiving layer comprised of one of InGaAsN, InGaAsNSb, and InGaAsNP, and a second light receiving layer having an absorption edge at a longer wavelength than that of the first light receiving layer and comprised of a quantum well structure.

CITATION LIST

Patent Literature

Patent Literature 1: Japanese Patent Application Laid-open No. 2008-153311

SUMMARY OF INVENTION

Technical Problem

However, such photodiodes using the compound semiconductors are still expensive and their manufacturing steps are also complicated. For this reason, there are desires for practical application of a silicon photodiode being inexpensive and easy to manufacture and having sufficient spectral sensitivity in the near-infrared wavelength band. The conventional silicon photodiodes generally had the spectral sensitivity characteristic with the limit of about 1100 nm on the long wavelength side, but the spectral sensitivity characteristic in the wavelength band of not less than 1000 nm was not enough.

It is an object of the present invention to provide a manufacturing method of a silicon photodiode as a photodiode with a sufficient spectral sensitivity characteristic in the near-infrared wavelength band, and provide such photodiodes.

Solution to Problem

A photodiode manufacturing method according to the present invention is a method comprising: a step of preparing a silicon substrate having a semiconductor substrate having a first principal surface and a second principal surface opposed to each other, an insulating layer provided on the second principal surface of the semiconductor substrate, a first impurity region of a first conductivity type provided on the insulating layer, and a low-concentration impurity region of the first conductivity type provided on the first impurity region and having a lower impurity concentration than the first impurity region; a step of forming a photosensitive region including an impurity region of a second conductivity type, in the low-concentration impurity region; a step of shaping the first impurity region and the low-concentration impurity region into a mesa shape to form a semiconductor mesa portion including the photosensitive region; a step of forming a second impurity region of the first conductivity type having a higher impurity concentration than the low-concentration impurity region, on a surface of the semiconductor mesa portion and forming a third impurity region of the first conductivity type having a higher impurity concentration than the low-concentration impurity region, on a side face of the semiconductor mesa portion, to electrically connect the first impurity region, the second impurity region, and the third impurity region; a step of thinning a portion in the semiconductor substrate corresponding to the photosensitive region, from the first principal surface side, while leaving a surrounding region around the thinned portion; a step of irradiating the thinned portion of the silicon substrate with a pulsed laser beam from the first principal surface side to form an irregular asperity; a step of subjecting the silicon substrate to a thermal treatment, after the step of forming the irregular asperity; and a step of, after the step of subjecting the silicon substrate to the thermal treatment, forming a first electrode on the semiconductor mesa portion so as to be electrically connected to the impurity region of the photosensitive region and forming a second electrode on the semiconductor mesa portion so as to be electrically connected to the second impurity region.

The photodiode manufacturing method according to the present invention allows us to obtain the photodiode wherein the portion corresponding to the photosensitive region in the silicon substrate is thinned and the irregular asperity is formed in the thinned portion of the silicon substrate. Since in this photodiode the irregular asperity is formed in the thinned portion of the silicon substrate, light incident into the photodiode is reflected, scattered, or diffused by the asperity to travel through a long distance in the low-concentration impurity region. This causes the light incident into the photodiode to be mostly absorbed in the low-concentration impurity region, without passing through the photodiode (low-concentration impurity region). In the photodiode, therefore, the travel distance of the light incident into the photodiode becomes long and the distance of absorption of light becomes long, so as to improve the spectral sensitivity characteristic in the near-infrared wavelength band.

In the photodiode obtained by the present invention, the first impurity region of the first conductivity type having the higher impurity concentration than the low-concentration impurity region is formed between the low-concentration impurity region and the insulating layer. This induces recombination of unnecessary carriers generated on the joint surface side to the insulating layer in the low-concentration impurity region and reduces dark current. The first impurity region prevents carriers generated near the joint surface of the low-concentration impurity region from being trapped in the joint surface. For this reason, the generated carriers efficiently migrate to the photosensitive region, so as to improve the photodetection sensitivity of the photodiode.

Incidentally, the irradiation with the pulsed laser beam could cause damage such as crystal defects to the silicon substrate (first impurity region). In the present invention, however, the silicon substrate is subjected to the thermal treatment, after formation of the irregular asperity, which can restore the crystallinity of the silicon substrate and prevent a problem such as increase of dark current.

Preferably, the step of forming the irregular asperity comprises irradiation with a picosecond to femtosecond pulsed laser beam as the pulsed laser beam. In this case, it is feasible to appropriately and readily form the irregular asperity.

Preferably, the insulating layer is comprised of silicon oxide, and the step of thinning comprises etching the semiconductor substrate from the first principal surface side, using the insulating layer as an etching stop layer. In this case, the etching stops at the insulating layer in the thinning step. For this reason, it is feasible to accurately and readily perform control on the thickness of the first impurity region.

Preferably, the thickness of the first impurity region is set to be larger than a height difference of the irregular asperity. In this case, the first impurity region remains even after the asperity is formed in the first impurity region with the pulsed laser beam reaching the first impurity region during the irradiation with the pulsed laser beam. As a result, it is feasible to ensure the aforementioned operational effect by the first impurity region.

A photodiode according to the present invention is one comprising: a silicon substrate portion having a semiconductor substrate having a first principal surface and a second principal surface opposed to each other, an insulating layer provided on the second principal surface of the semiconductor substrate, and a semiconductor mesa portion provided on the insulating layer and having a principal surface formed opposite to a joint surface to the insulating layer; and a first electrode and a second electrode provided on the principal surface of the semiconductor mesa portion, wherein the semiconductor mesa portion comprises: a first impurity region of a first conductivity type provided on the joint surface to the insulating layer; a low-concentration impurity region of the first conductivity type provided on the first impurity region and having a lower impurity concentration than the first impurity region; a photosensitive region provided in the low-concentration impurity region and including an impurity region of a second conductivity type; a second impurity region of the first conductivity type provided on the principal surface of the semiconductor mesa portion in the low-concentration impurity region and having a higher impurity concentration than the low-concentration impurity region; and a third impurity region of the first conductivity type provided on a side face of the semiconductor mesa portion in the low-concentration impurity region and having a higher impurity concentration than the low-concentration impurity region, wherein in the silicon substrate portion, a portion corresponding to the photosensitive region is thinned from the semiconductor substrate side while leaving a surrounding region around the thinned portion, wherein an irregular asperity is formed in a surface opposed to the principal surface of the semiconductor mesa portion in the thinned portion of the silicon substrate portion and the surface is optically exposed, wherein the third impurity region is electrically connected to the first impurity region and the second impurity region, and wherein the first electrode is electrically connected to the impurity region of the photosensitive region and the second electrode is electrically connected to the second impurity region.

In the photodiode according to the present invention, as described above, the travel distance of light incident into the photodiode becomes long and the distance of absorption of light becomes long. For this reason, the present invention improves the spectral sensitivity characteristic in the near-infrared wavelength band. The first impurity region reduces the dark current and improves the photodetection sensitivity of the photodiode.

Preferably, the irregular asperity is formed in the first impurity region and the first impurity region is optically exposed.

Preferably, a thickness of the first impurity region is larger than a height difference of the irregular asperity. In this case, as described above, it is feasible to ensure the operational effect by the first impurity region.

Advantageous Effects of Invention

The present invention provides the photodiode manufacturing method and the photodiodes of silicon photodiodes with the sufficient spectral sensitivity characteristic in the near-infrared wavelength band.

BRIEF DESCRIPTION OF DRAWINGS

FIG. 7 is a drawing for explaining a photodiode manufacturing method according to an embodiment of the present invention.

FIG. 12 is a drawing for explaining the photodiode manufacturing method according to the embodiment.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

Figure 1:
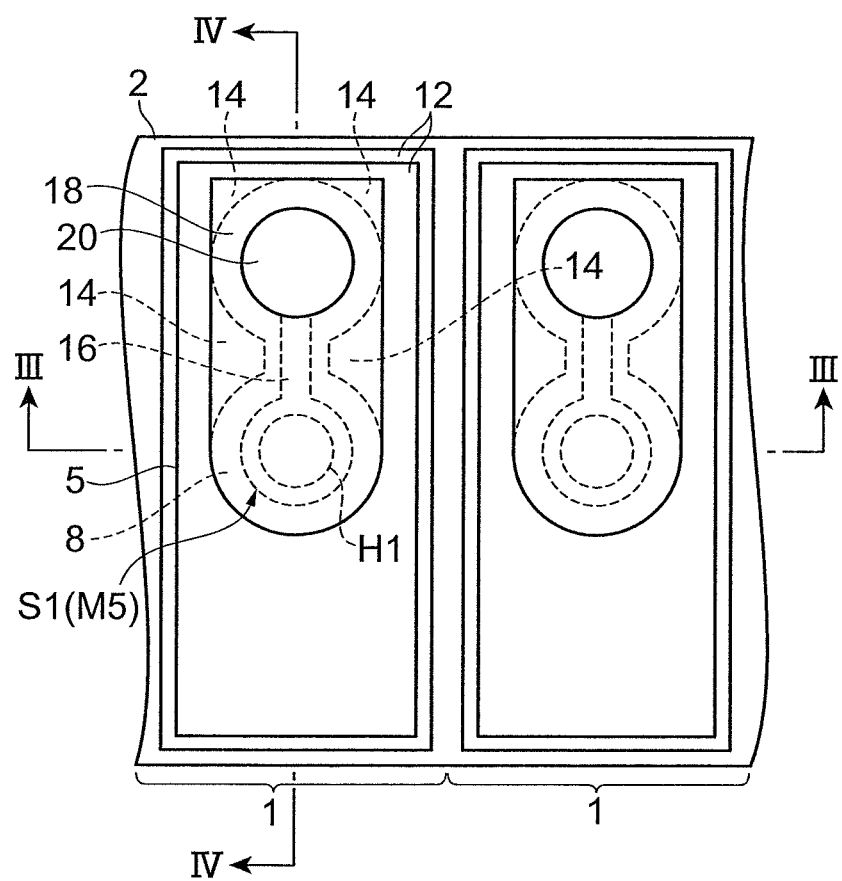
FIG. 1 is a plan view of photodiodes according to an embodiment of the present invention.
Figure 3:
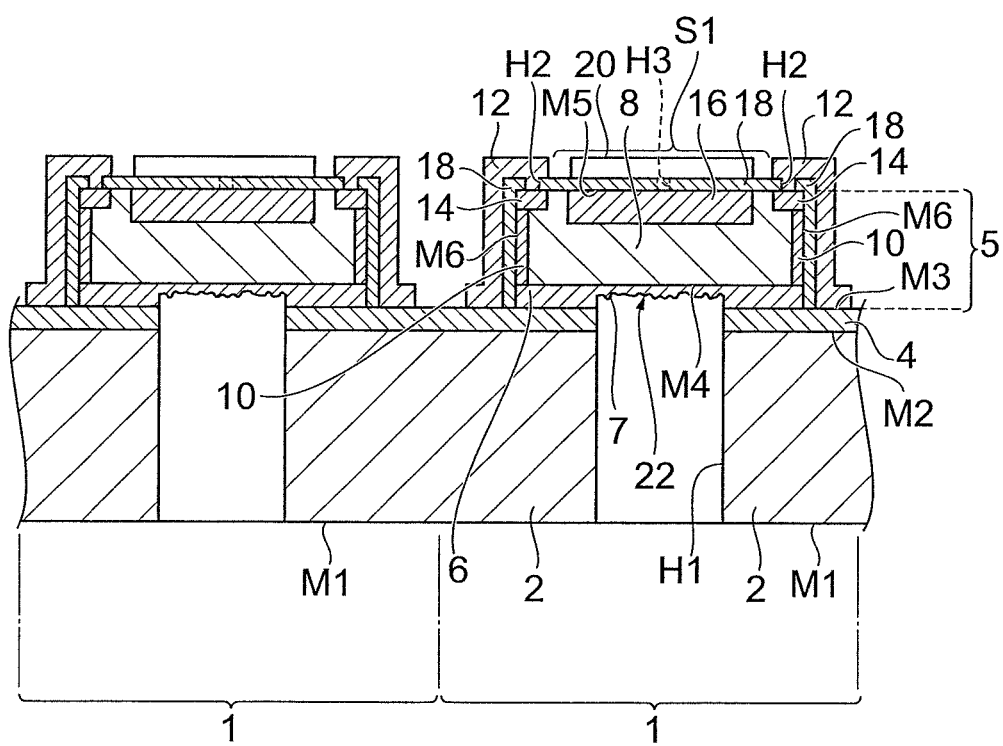
FIG. 3 is a drawing showing a cross-sectional configuration along the line III-III in FIG. 1.
Figure 4:
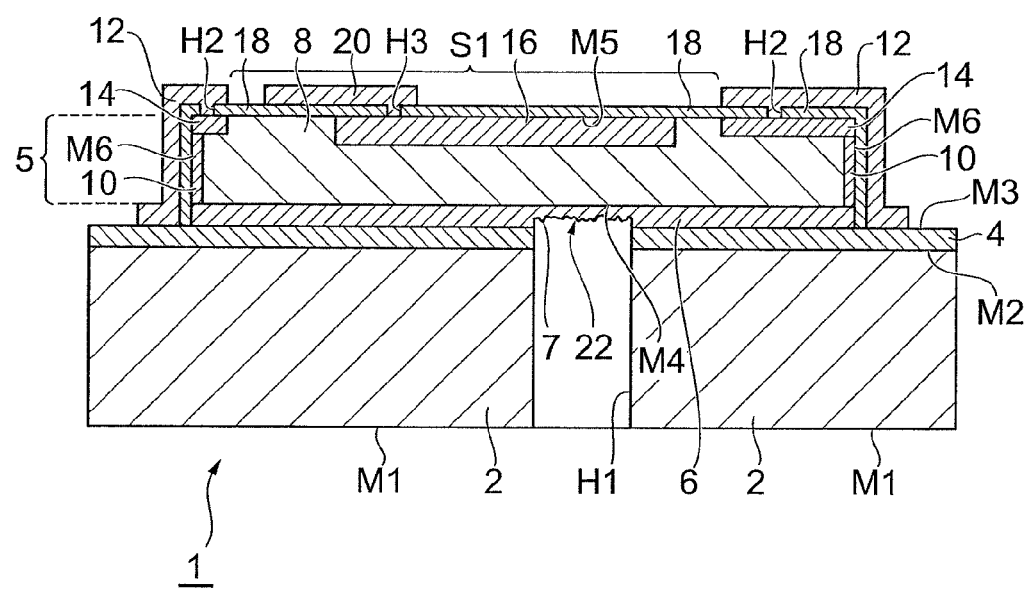
FIG. 4 is a drawing showing a cross-sectional configuration along the line IV-IV in FIG. 1.

A configuration of photodiodes 1 according to an embodiment of the present invention will be described with reference to FIGS. 1 to 4. FIG. 1 is a plan view of the photodiodes according to the present embodiment, and FIG. 2 a bottom view of the photodiodes shown in FIG. 1. FIG. 3 is a drawing showing a cross-sectional configuration along the line III-III in FIG. 1. FIG. 4 is a drawing showing a cross-sectional configuration along the line IV-IV in FIG. 1. FIGS. 1 to 4 show a photodiode array in which the plurality of photodiodes 1 are provided in parallel.

The photodiodes 1 generate carriers with incidence of detection target light and output the generated carriers in the form of detection signals. As shown in FIG. 1, each photodiode 1 has a semiconductor substrate 2 having a first principal surface M1 and a second principal surface M2 opposed to each other, and a semiconductor mesa portion 5 arranged on the semiconductor substrate 2. The semiconductor substrate 2 is a substrate which supports the semiconductor mesa portions 5 and others arranged on the semiconductor substrate 2 and which is comprised of silicon (Si) crystal. Each semiconductor mesa portion 5 is a semiconductor layer including an $n^-$ type layer 8 of mesa shape. The photodiode 1 constitutes a so-called PIN photodiode.

The $n^-$ type layer 8 is a semiconductor layer containing an n-type impurity (e.g., antimony, arsenic, phosphorus, or the like). The photodiode 1 has an n⁺ type region 14 and a p⁺ type region 16, and has a photosensitive region S1 which detects incident light. The n⁺ type region 14 and p⁺ type region 16 are provided on a principal surface of the semiconductor mesa portion 5 (surface M5 shown in FIG. 3 and others) in the n⁻ type layer 8. The n⁺ type region 14 is provided so as to surround the p⁺ type region 16 on the surface M5, i.e., so as to surround the photosensitive region S1.

The n⁺ type region 14 is a semiconductor region containing an n-type impurity in a higher concentration than the n⁻ type layer 8. The p⁺ type region 16 is a semiconductor region containing a p-type impurity (e.g., boron or the like) in a relatively high concentration (e.g., in a higher concentration than the n⁻ type layer 8). The photosensitive region S1 is a region which is provided in the n⁻ type layer 8 and which includes the p⁺ type region 16, and a pn junction portion formed at the interface between the p⁺ type region 16 and the n⁻ type layer 8. In the present embodiment, a "high concentration" refers to, for example, an impurity concentration of not less than about $1 \times 10^{17}$ cm⁻³ and is denoted by "+" attached to conductivity type. A "low concentration" refers to, for example, an impurity concentration of not more than about $1 \times 10^{15}$ cm⁻³ and is denoted by "−" attached to conductivity type.

The photodiode 1 has a cathode electrode 12 and an anode electrode 20 provided on the principal surface (surface M5) of the semiconductor mesa portion 5. Namely, the cathode electrode 12 and anode electrode 20 are provided on the same surface (surface M5). The cathode electrode 12 and anode electrode 20 are comprised of, for example, an electrically conductive metal such as aluminum. The cathode electrode 12 is provided so as to cover the n⁺ type region 14. The cathode electrode 12 and n⁺ type region 14 are electrically connected to each other. The anode electrode 20 is provided as shifted to a longitudinal end on the surface M5. The p⁺ type region 16 is provided near the center of the surface M5 and extends up to a region below the anode electrode 20. The p⁺ type region 16 (a part of the photosensitive region S1) and the anode electrode 20 are electrically connected to each other. Instead of the configuration wherein the p⁺ type region 16 extends from near the center of the surface M5 to the region below the anode electrode 20, it is also possible to adopt a configuration wherein the p⁺ type region 16 is provided only near the center of the surface M5 and the anode electrode extends to the p⁺ type region 16 to be electrically connected thereto. This configuration can reduce capacitance.

The photodiode 1 has an insulating layer 4, an n⁺ type embedded layer 6, and an insulating film 18. The semiconductor mesa portion 5 is disposed on the insulating layer 4 and the semiconductor mesa portion 5 has the n⁺ type embedded layer 6 and n⁻ type layer 8. The principal surface (surface M5) of the semiconductor mesa portion 5 is formed opposite to a joint surface to the insulating layer 4. The insulating layer 4 is provided on the second principal surface M2 of the semiconductor substrate 2 and the n⁺ type embedded layer 6 is provided on a surface M3 of the insulating layer 4 (in other words, the n⁺ type embedded layer 6 is provided on the joint surface of the semiconductor mesa portion 5 to the insulating layer 4). The insulating layer 4 is comprised, for example, of silicon oxide or the like and prevents carriers generated with incidence of detection target light into the semiconductor substrate 2 from flowing into the n⁺ type embedded layer 6 and n⁻ type layer 8. The n⁻ type layer 8 is provided on a surface M4 of the n⁺ type embedded layer 6. The n⁺ type embedded layer 6 is a semiconductor layer containing an n-type impurity in a higher concentration than the n⁻ type layer 8.

The photodiode 1 has an n⁺ type connection region 10. The n⁺ type connection region 10 is provided on side faces M6 of the n⁻ type layer 8 so as to surround the photosensitive region S1 in the n⁻ type layer 8. The n⁺ type connection region 10, like the n⁺ type embedded layer 6 and n⁺ type region 14, is a semiconductor region containing an n-type impurity in a higher concentration than the n⁻ type layer 8. The n⁺ type connection region 10 is electrically connected to the n⁺ type embedded layer 6 and the n⁺ type region 14.

The photodiode 1 has the insulating film 18. The insulating film 18 is provided on the surface M5 and side faces M6 of the semiconductor mesa portion 5 and is comprised of, for example, silicon oxide or the like. A contact hole H2 is formed in the insulating film 18 and the contact hole H2 is provided on the n⁺ type region 14.

The cathode electrode 12 extends along the insulating film 18 on the surface M5 and side faces M6 from a region except for the semiconductor mesa portion 5 in the surface M3 of the insulating layer 4 to the contact hole H2. The cathode electrode 12 is electrically connected to the n⁺ type region 14 through the contact hole H2.

A contact hole H3 is formed, as shown in FIG. 4, in the insulating film 18. The contact hole H3 is provided on the p⁺ type region 16. The anode electrode 20 is electrically connected to the p⁺ type region 16 through the contact hole H3.

In the semiconductor substrate 2, as shown in FIGS. 3 and 4, a portion corresponding to the p⁺ type region 16 (a part of the photosensitive region S1) is thinned from the first principal surface M1 side while leaving a surrounding region around the thinned portion. In the present embodiment, a part corresponding to the p⁺ type region 16 (a part of the photosensitive region S1) in the semiconductor substrate 2 and the insulating layer 4 is also removed. In this configuration, a hole H1 penetrating through these semiconductor substrate 2 and insulating layer 4 is formed in the semiconductor substrate 2 and the insulating layer 4, whereby the n⁺ type embedded layer 6 is exposed in the hole H1.

Figure 2:
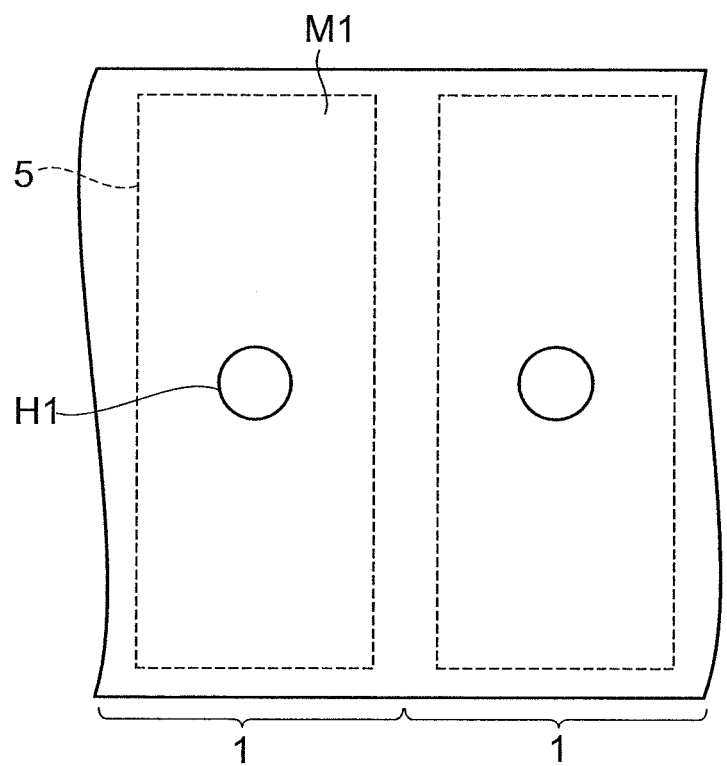
FIG. 2 is a bottom view of the photodiodes shown in FIG. 1.

The hole H1 opens in the first principal surface M1 opposite to the surface M5 (cf. FIG. 2). The hole H1 is provided at a position corresponding to the p⁺ type region 16 (part of the photosensitive region S1) and penetrates the semiconductor substrate 2 and insulating layer 4 to reach the n⁺ type embedded layer 6. Namely, the hole H1 provided at the position corresponding to the photosensitive region S1 extends from the first principal surface M1 of the semiconductor substrate 2 to the n⁺ type embedded layer 6. The hole H1 is of a nearly cylindrical shape having a circular cross section with the size (diameter) of about 100 μm.

The cathode electrode 12 and anode electrode 20 are not provided at the position corresponding to the hole H1. Namely, the cathode electrode 12 and anode electrode 20 are provided at their respective positions corresponding to the surrounding region around the hole H1 in the semiconductor substrate 2. This configuration lets the semiconductor substrate 2 support a load of stress acting through the cathode electrode 12 and anode electrode 20 on the photodiode 1. This results in improving the structural strength of the photodiode 1. In the photodiode array with the plurality of photodiodes 1 in parallel, the photodiodes 1 are arranged in parallel at the pitch of about 0.25 mm. The distance between centers of the respective holes H1 of two adjacent photodiodes 1 is approximately 0.25 mm.

Figure 5:
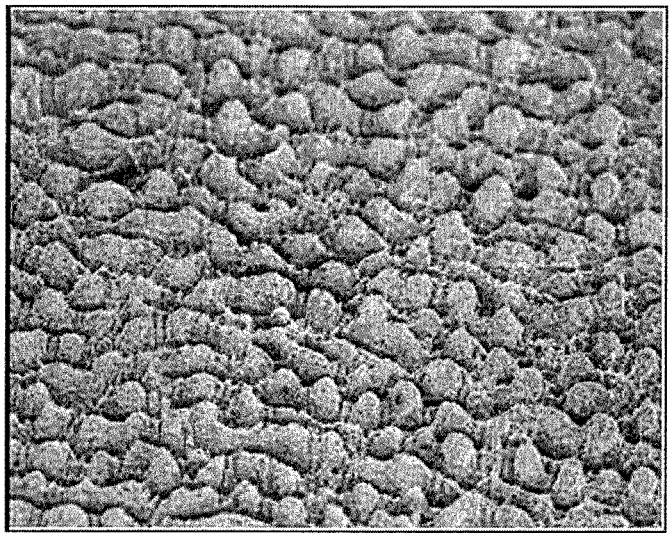
FIG. 5 is an SEM image resulting from observation of an irregular asperity formed in a surface of an $n^+$ embedded layer exposed in a hole.

An irregular asperity 22 is formed, as shown in FIG. 5, in a surface 7 of the n⁺ type embedded layer 6 exposed in the hole H1. The surface 7 of the n⁺ type embedded layer 6 exposed in the hole H1 is optically exposed. That the surface 7 is optically exposed embraces, not only the case where the surface 7 is in contact with ambient gas such as air, but also the case where an optically transparent film is formed on the surface 7.

The photodiode 1 of the above configuration functions as a front-illuminated type photodiode to detect light incident from the semiconductor mesa portion 5 side and also functions as a back-thinned type photodiode to detect light incident from the semiconductor substrate 2 side. In the case where the photodiode 1 functions as a front-illuminated type photodiode, the detection target light is incident from the principal surface (surface M5) of the semiconductor mesa portion 5 into the n$^-$ type layer 8. In the case where the photodiode 1 functions as a back-thinned type photodiode, the detection target light is incident from the hole H1 through the n$^+$ type embedded layer 6 into the n$^-$ type layer 8. In either case, the light incident into the n$^-$ type layer 8 is absorbed in the n$^-$ type layer 8 to generate carriers. The carriers with positive charge (holes) migrate to the photosensitive region S1 to be extracted as an electric signal through the anode electrode 20.

Figure 6:
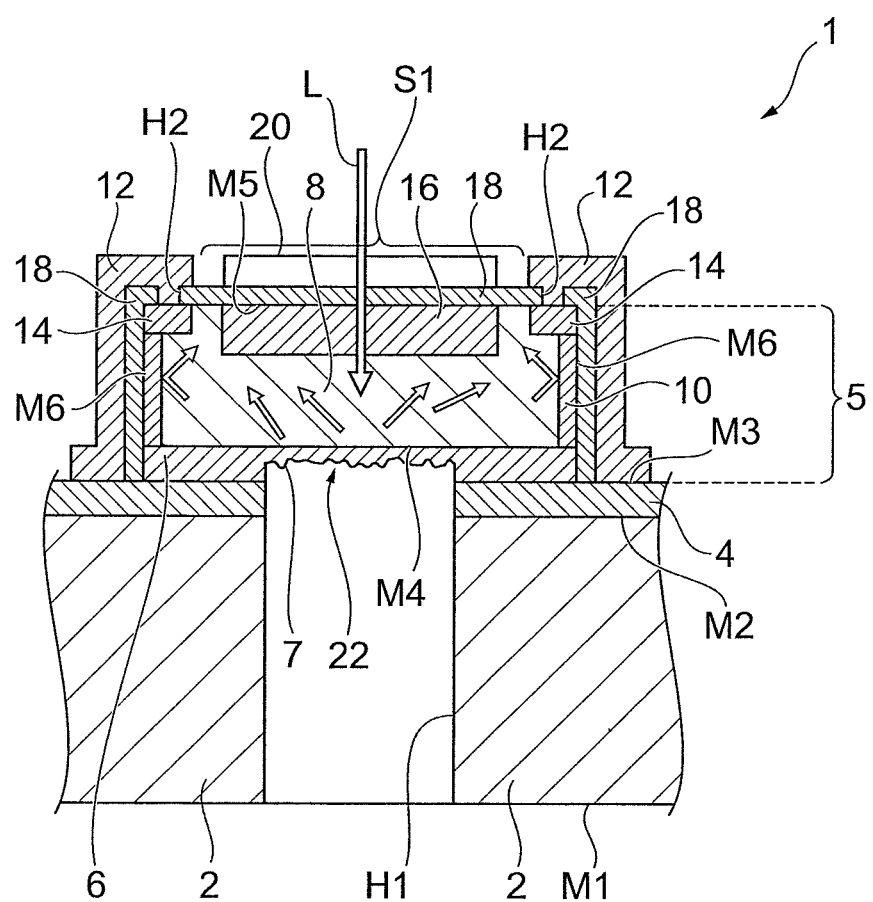
FIG. 6 is a drawing showing a configuration of a photodiode according to an embodiment of the present invention.
Figure 8:
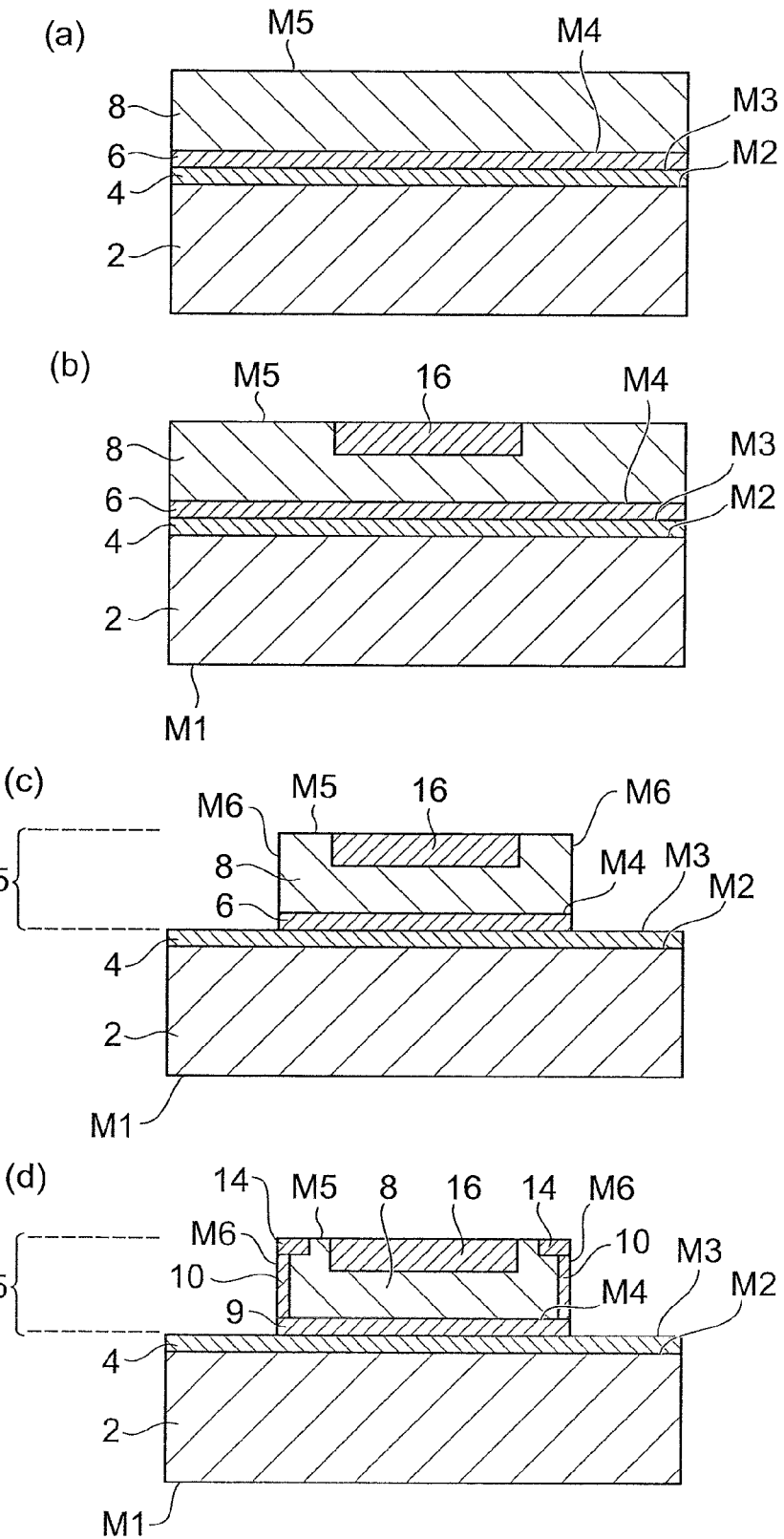
FIG. 8 is a drawing for explaining the photodiode manufacturing method according to the embodiment.

Since in the photodiode 1 the irregular asperity 22 is formed in the surface 7 of the n$^+$ type embedded layer 6 exposed in the hole H1, the light L incident into the photodiode 1 is reflected, scattered, or diffused by the asperity 22, as shown in FIG. 6, to travel through a long distance in the n$^-$ type layer 8. FIG. 6 shows an example in which the photodiode 1 functions as a front-illuminated type photodiode.

Normally, Si has the refractive index n=3.5 and air the refractive index n=1.0. In a photodiode, when light is incident from a direction normal to a light incident surface, light remaining unabsorbed in the photodiode (silicon substrate) is separated into a light component reflected on a back surface to the light incident surface and a light component passing through the photodiode. The light passing through the photodiode does not contribute to the sensitivity of the photodiode. The light component reflected on the back surface to the light incident surface, if absorbed in the photodiode, becomes a photocurrent, whereas a light component still remaining unabsorbed is reflected or transmitted on the light incident surface as the light component having reached the back surface to the light incident surface was.

In the photodiode 1, where the light L is incident from the direction normal to the light incident surface (principal surface of the semiconductor mesa portion 5 (surface M5)), when the light arrives at the irregular asperity 22 formed in the surface 7 of the n$^+$ type embedded layer 6 exposed in the hole H1, light components arriving thereat at angles of not less than 16.6° to the direction of emergence from the asperity 22 are totally reflected by the asperity 22. Since the asperity 22 is formed irregularly, it has various angles relative to the emergence direction and thus the totally reflected light components diffuse into various directions. For this reason, the totally reflected light components include light components absorbed inside the n$^-$ type layer 8 and light components reaching the principal surface (surface M5) and side faces M6 of the semiconductor mesa portion 5.

The light components reaching the principal surface (surface M5) and side faces M6 of the semiconductor mesa portion 5 travel in various directions because of the diffusion on the asperity 22. For this reason, the light components reaching the principal surface (surface M5) and side faces M6 of the semiconductor mesa portion 5 are extremely highly likely to be totally reflected on the principal surface (surface M5) and side faces M6 of the semiconductor mesa portion 5. The light components totally reflected on the principal surface (surface M5) and the side faces M6 of the semiconductor mesa portion 5 are repeatedly totally reflected on different faces to further increase the distance of propagation inside the semiconductor mesa portion 5. While the light L incident into the photodiode 1 travels through the long distance inside the n$^-$ type layer 8, it is absorbed in the n$^-$ type layer 8 to be detected as a photocurrent.

The light L incident into the photodiode 1 mostly travels through the long propagation distance inside the photodiode 1 to be absorbed in the n$^-$ type layer 8, without passing through the photodiode 1. Therefore, the photodiode 1 is improved in the spectral sensitivity characteristic in the near-infrared wavelength band. In the case where the photodiode 1 functions as a back-thinned type photodiode, it is also improved in the spectral sensitivity characteristic in the near-infrared wavelength band, as in the case where the photodiode functions as a front-illuminated type photodiode.

If a regular asperity is formed in the surface 7 of the n$^+$ type embedded layer 6 exposed in the hole H1, the light components reaching the principal surface (surface M5) and the side faces M6 of the semiconductor mesa portion 5 are those diffused by the asperity but they travel in uniform directions. Therefore, the light components reaching the principal surface (surface M5) and the side faces M6 of the semiconductor mesa portion 5 are less likely to be totally reflected on the second principal surface M2 and the side faces M6. This results in increasing the light components passing through the principal surface (surface M5) and the side faces M6 of the semiconductor mesa portion 5 and further through the surface 7 of the n$^+$ type embedded layer 6 exposed in the hole H1 and decreasing the propagation distance inside the photodiode of the light incident into the photodiode. As a result, it becomes difficult to improve the spectral sensitivity characteristic in the near-infrared wavelength band.

The following will describe a manufacturing method of the photodiode 1 according to the present embodiment, with reference to FIGS. 7 to 12. FIGS. 7 to 12 are drawings for explaining the manufacturing method of the photodiode according to the present embodiment.

The first step is to prepare an n$^-$ type semiconductor substrate 8a comprised of Si crystal. The n$^-$ type semiconductor substrate 8a has the thickness of about 300 μm and the resistivity of about 1 kΩ·cm (cf. FIG. 7(a)). Into the n$^-$ type semiconductor substrate 8a, antimony (Sb) is diffused from a surface thereof. An impurity concentration is approximately $2 \times 10^{19}$ cm$^{-3}$. This forms an n$^+$ type semiconductor layer 6a in a surface layer of the n$^-$ type semiconductor substrate 8a (cf. FIG. 7(b)). The n$^+$ type semiconductor layer 6a has the thickness of about 3 μm. A support substrate 2a of Si crystal prepared separately is subjected to oxidation of surface, whereby an insulating layer 4a of silicon oxide (SiO$_2$) is formed on the support substrate 2a. The support substrate 2a has the thickness of about 300 μm. The insulating layer 4a has the thickness of 1 μm (cf. FIG. 7(c)).

Next, the structure consisting of the n$^+$ type semiconductor layer 6a and the n$^-$ type semiconductor substrate 8a is bonded to the substrate with the insulating layer 4a on the support substrate 2a by heating them at about 1000° C. At this time, the surface of the insulating layer 4a is a surface to be bonded to the n$^+$ type semiconductor layer 6a (cf. FIG. 7(d)). Furthermore, the surface of the n$^-$ type semiconductor substrate 8a is planarized by polishing. By this polishing, the sum of the thicknesses of the n$^-$ type semiconductor substrate 8a and the n$^+$ type semiconductor layer 6a is adjusted to a desired thickness, e.g., about 9 μm. Through the above steps, we obtain the substrate in the structure shown in FIG. 8(a), so called an SOI (Silicon on Insulator) substrate, wherein the insulating layer 4 (corresponding to the insulating layer 4a) is located on the second principal surface M2 of the semiconductor substrate 2 (corresponding to the support substrate 2a), the first conductivity type n⁺ type embedded layer 6 (corresponding to the n⁺ type semiconductor layer 6a) is located on the surface M3 of the insulating layer 4, and the n⁻ type layer 8 (corresponding to the n⁻ type semiconductor substrate 8a) containing an n-type impurity in a lower concentration than the n⁺ type embedded layer 6 is located on the surface M4 of the n⁺ type embedded layer 6.

Next, as shown in FIG. 8(b), a p-type impurity is diffused in a relatively high concentration into the surface M5 in the n⁻ type layer 8 to form the p⁺ type region 16, thereby forming the photosensitive region S1 including the p⁺ type region 16. Then, as shown in FIG. 8(c), the n⁺ type embedded layer 6 and n⁻ type layer 8 are dry etched to shape them in a mesa form while leaving the p⁺ type region 16 and a surrounding region thereof (i.e., the photosensitive region S1 and the electrode region), until the insulating layer 4 is exposed. This process results in forming the semiconductor mesa portion 5 including the photosensitive region S1. In this case, the insulating layer 4 functions as an etching stopper. Thereafter, as shown in FIG. 8(d), an n-type impurity is diffused in a higher concentration than in the n⁻ type layer 8 to form the n⁺ type region 14 so as to surround the photosensitive region S1 in the surface M5 of the semiconductor mesa portion 5. Furthermore, an n-type impurity is diffused in a higher concentration than in the n⁻ type layer 8, to form the n⁺ type connection region 10 so as to surround the photosensitive region S1 in the side faces M6 of the semiconductor mesa portion 5. This causes the n⁺ type embedded layer 6, the n⁺ type region 14, and the n⁺ type connection region 10 to be electrically connected to each other.

Figure 9:
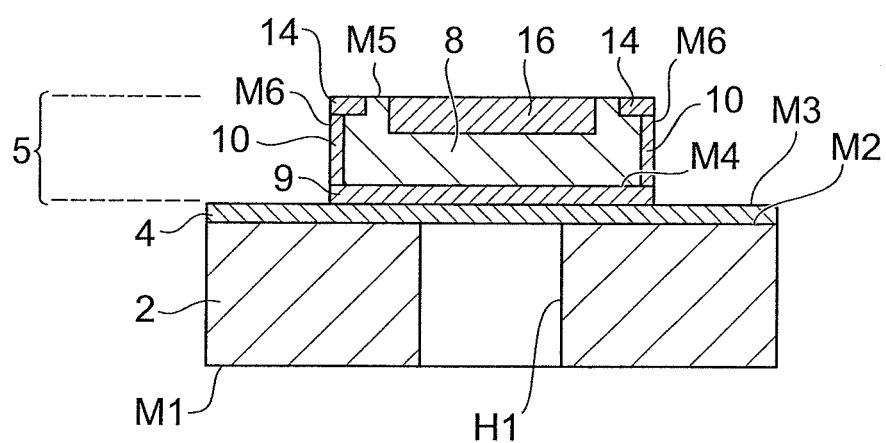
FIG. 9 is a drawing for explaining the photodiode manufacturing method according to the embodiment.

Next, as shown in FIG. 9, the semiconductor substrate 2 is subjected to dry etching or the like until the insulating layer 4 is exposed, whereby the hole H1 penetrating through the semiconductor substrate 2 and reaching the insulating layer 4 is formed at the position corresponding to the photosensitive region S1. In this case, the insulating layer 4 functions as an etching stop layer.

Figure 10:
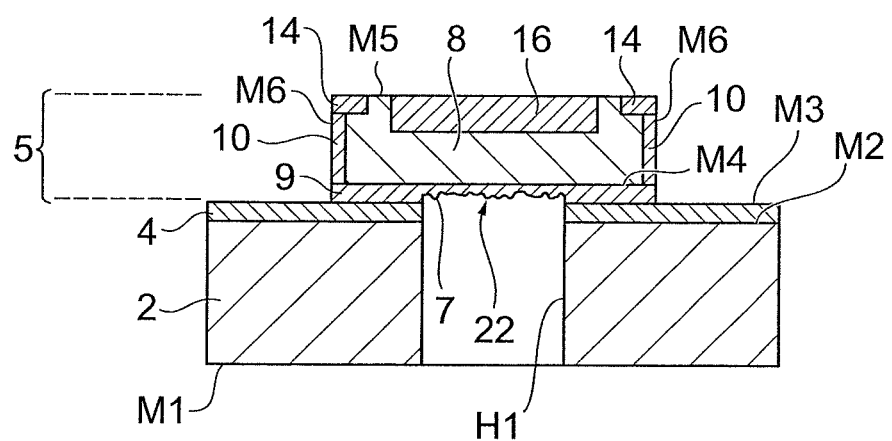
FIG. 10 is a drawing for explaining the photodiode manufacturing method according to the embodiment.
Figure 11:
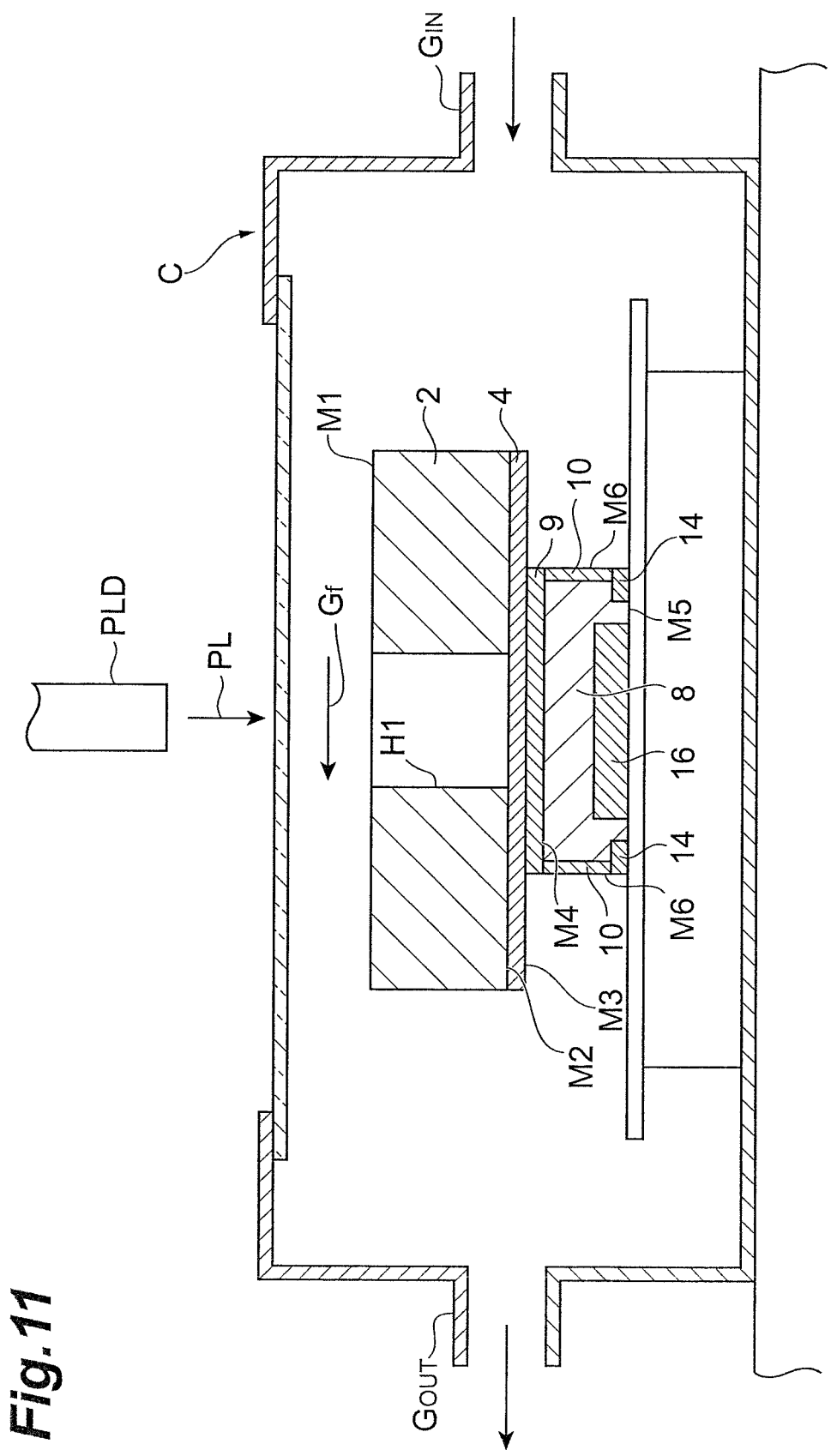
FIG. 11 is a drawing for explaining the photodiode manufacturing method according to the embodiment.

Next, as shown in FIG. 10, the irregular asperity 22 is formed in the surface 7 of the n⁺ type embedded layer 6 exposed in the hole H1. In this step, as shown in FIG. 11, the substrate with the hole H1 therein is placed in a chamber C and the substrate is irradiated with a pulsed laser beam PL from a pulse laser generating device PLD located outside the chamber C. The chamber C has a gas inlet port $G_{IN}$ and a gas outlet port $G_{OUT}$. An inert gas (e.g., nitrogen gas, argon gas, or the like) is introduced through the gas inlet port $G_{IN}$ and discharged through the gas outlet port $G_{OUT}$, thereby forming an inert gas flow $G_f$ in the chamber C. Dust and other materials produced during the irradiation with the pulsed laser beam PL are discharged to the outside of the chamber C as trapped into the inert gas flow $G_f$, thereby preventing processing debris, dust, and other materials from attaching to the substrate. In the present embodiment, the pulse laser generating device PLD used is a picosecond to femtosecond pulse laser generating device and a picosecond to femtosecond pulsed laser beam is applied across the entire surface of the insulating layer 4 exposed in the hole H1 of the n⁺ type embedded layer 6.

When the surface of the n⁺ type embedded layer 6 exposed in the hole H1 through the insulating layer 4 is irradiated with the picosecond to femtosecond pulsed laser beam, the insulating layer 4 is removed and the surface 7 of the n⁺ type embedded layer 6 exposed in the hole H1 is roughened by the picosecond to femtosecond pulsed laser beam. This results in forming the irregular asperity 22 in the entire area of the surface 7, as shown in FIG. 5. The irregular asperity 22 has facets intersecting with the direction perpendicular to the principal surface (surface M5) of the semiconductor mesa portion 5. The height difference of the asperity 22 is, for example, about 0.5 to 10 μm and the spacing of projections in the asperity 22 is about 0.5 to 10 μm. The picosecond to femtosecond pulsed laser beam has the pulse duration of, for example, about 50 fs to 2 ps, the intensity of, for example, about 4 to 16 GW, and the pulse energy of, for example, about 200 to 800 μJ/pulse. More generally, the peak intensity is about $3\times10^{11}$ to $2.5\times10^{13}$ (W/cm²) and the fluence about 0.1 to 1.3 (J/cm²).

Next, the substrate with the irregular asperity 22 therein is subjected to a thermal treatment (anneal). In this step, the substrate with the irregular asperity 22 therein is heated in the temperature range of about 800 to 1000° C. in an ambiance of $N_2$ gas or the like for about 0.5 to 1 hour.

Next, as shown in FIG. 12(a), the insulating film 18 is formed on the surface M5 and the side faces M6. Then the contact hole H2 is formed in the insulating film 18 on the n⁺ type region 14 and the contact hole H3 is formed in the insulating film 18 on the p⁺ type region 16. Thereafter, as shown in FIG. 12(b), the cathode electrode 12 is formed along the insulating film 18 on the surface M5 and the side faces M6 from the region except for the semiconductor mesa portion 5 in the surface M3 of the insulating layer 4 to the contact hole H2, so as to be electrically connected through the contact hole H2 to the n⁺ type region 14. Namely, the cathode electrode 12 is formed on the semiconductor mesa portion 5 so as to be electrically connected to the n⁺ type region 14. At the same time, the anode electrode 20 is provided on the p⁺ type region 16 including the contact hole H3, to be electrically connected through the contact hole H3 to the p⁺ type region 16. Namely, the anode electrode 20 is formed on the semiconductor mesa portion 5 so as to be electrically connected to the photosensitive region S1.

The above completes the photodiode 1.

An experiment was conducted in order to check the effect of improvement in the spectral sensitivity characteristic in the near-infrared wavelength band by the present embodiment.

We fabricated a photodiode with the above-described configuration (referred to as Example 1) and a photodiode without the hole H1 and the irregular asperity 22 (referred to as Comparative Example 1) and investigated their respective spectral sensitivity characteristics. As Comparative Example 1, the photodiode was fabricated in a structure having an n-type first semiconductor substrate with low resistivity and an n-type second semiconductor substrate with high resistivity bonded onto the first semiconductor substrate, wherein a p-type semiconductor region was formed on the front surface side of the second semiconductor substrate, a region around the semiconductor region in the second semiconductor substrate was etched before the first semiconductor substrate was exposed, and the first and second electrodes were electrically connected to the exposed surface of the first semiconductor substrate and the semiconductor region, respectively. Comparative Example 1 does not employ the configuration corresponding to the hole H1 and irregular asperity 22 in Example 1. In Comparative Example 1 the thickness of the second semiconductor substrate was set to 7.5 μm. In Example 1 the thickness of the n⁻ type layer 8 was set to 6 μm. In both of Example 1 and Comparative Example 1, the size of the photodiode was set to 0.5 mm×0.5 mm and the size of the photosensitive region to φ0.1 mm. The bias voltage VR applied to the photodiodes was set to 0 V.

Figure 13:
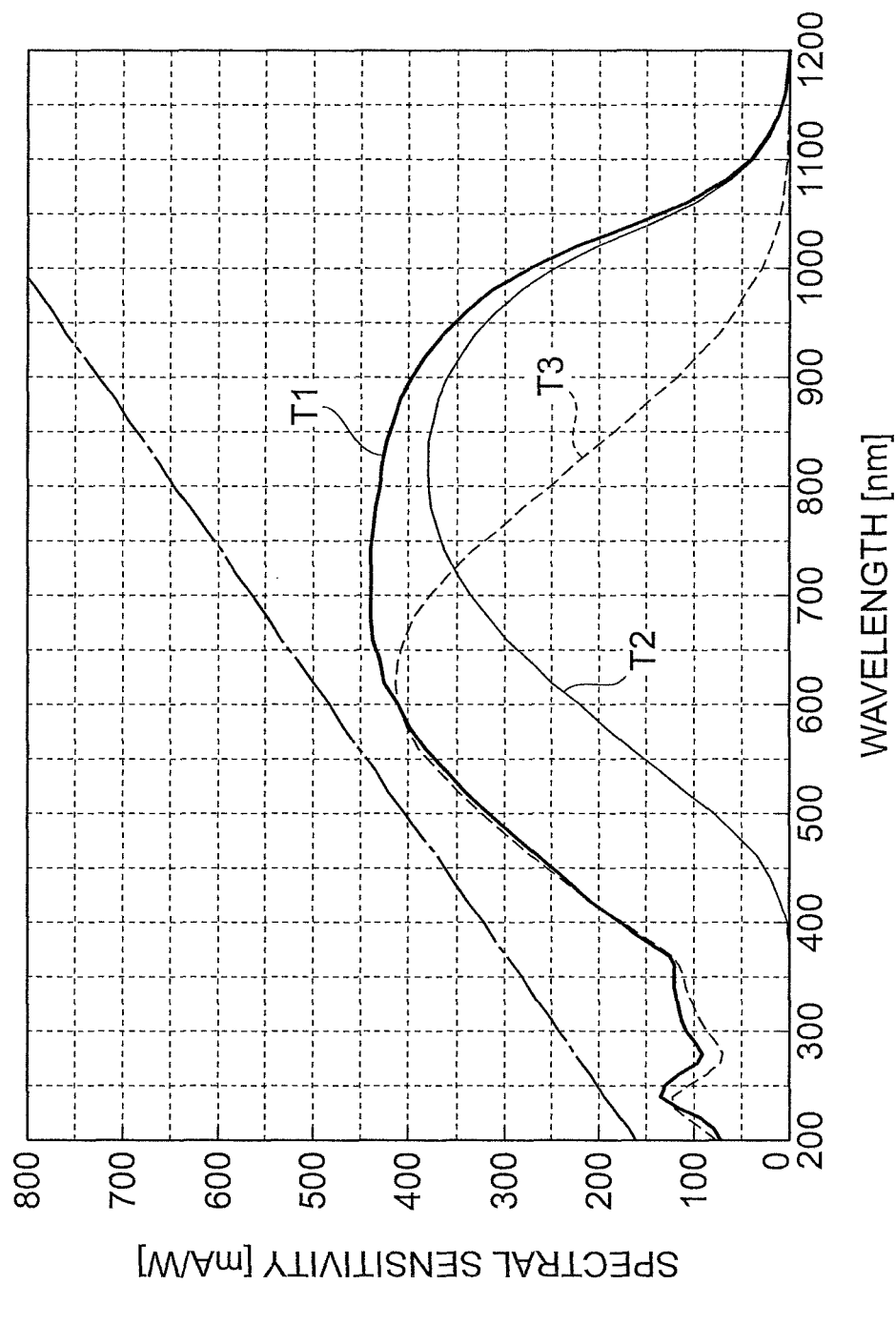
FIG. 13 is a diagram showing changes of spectral sensitivity versus wavelength in Example 1 and Comparative Example 1.

The results are shown in FIG. 13. In FIG. 13, T1 represents a spectral sensitivity characteristic in the case where Example 1 was used as a front-illuminated type photodiode; T2 represents a spectral sensitivity characteristic in the case where Example 1 was used as a back-thinned type photodiode. The spectral sensitivity characteristic of Comparative Example 1 is represented by characteristic T3. In FIG. 13, the vertical axis represents the spectral sensitivity (mA/W) and the horizontal axis the wavelength of light (nm). A characteristic indicated by a chain line represents a spectral sensitivity characteristic where the quantum efficiency (QE) is 100%.

As seen from FIG. 13, for example at 850 nm, the spectral sensitivity is 0.18 A/W (QE=25%) in Comparative Example 1, whereas the spectral sensitivity is 0.42 A/W (QE=60%) and 0.38 A/W (QE=55%) in Example 1, thus confirming that the spectral sensitivity is drastically improved in the near-infrared wavelength band.

In the photodiode 1 the irregular asperity 22 is formed in the $n^+$ type embedded layer 6. This induces recombination of unnecessary carriers generated on the surface 7 side of the $n^+$ type embedded layer 6 exposed in the hole H1 and thus reduces the dark current. The $n^+$ type embedded layer 6 prevents carriers generated near the surface 7 of the $n^+$ type embedded layer 6 exposed in the hole H1, from being trapped in the surface 7. Namely, the $n^+$ type embedded layer 6 functions as an accumulation layer. For this reason, the generated carriers efficiently migrate to the photosensitive region S1, so as to further improve the photodetection sensitivity of the photodiode 1.

The irradiation with the pulsed laser beam PL during the formation of the irregular asperity 22 could cause damage such as crystal defects to the semiconductor layers such as the $n^+$ type embedded layer 6 and the $n^-$ type layer 8. In the present embodiment, however, the thermal treatment is carried out after the formation of the irregular asperity 22 in the surface 7 of the $n^+$ type embedded layer 6 exposed in the hole H1, which restores the crystallinity of the semiconductor layers such as the $n^+$ type embedded layer 6 and the $n^-$ type layer 8. As a result, it is feasible to prevent the problem such as increase of dark current.

In the present embodiment, the cathode electrode 12 and the anode electrode 20 are formed after the formation of the irregular asperity 22 and the thermal treatment. This prevents the cathode electrode 12 and the anode electrode 20 from melting during the thermal treatment, even if the cathode electrode 12 and the anode electrode 20 are made of a metal with a relatively low melting point. As a result, the cathode electrode 12 and the anode electrode 20 can be appropriately formed without being affected by the thermal treatment.

In the present embodiment, the thickness of the $n^+$ type embedded layer 6 is set to be larger than the height difference of the irregular asperity 22. For this reason, the $n^+$ type embedded layer 6 remains with certainty even after the irregular asperity 22 is formed by the irradiation with the pulsed laser beam, after the formation of the $n^+$ type embedded layer 6. Therefore, it is feasible to ensure the operational effect by the $n^+$ type embedded layer 6.

In the present embodiment, the irregular asperity 22 is foamed by the irradiation with the picosecond to femtosecond pulsed laser beam. This allows the irregular asperity 22 to be appropriately and readily formed.

In the present embodiment, the semiconductor substrate 2 is etched while the insulating layer 4 of silicon oxide serves as an etching stop layer. For this reason, the etching stops at the insulating layer 4, whereby it is feasible to accurately and readily perform control on the thickness of the $n^-$ type layer 8.

The above described the preferred embodiments of the present invention, but it should be noted that the present invention is not always limited to the above-described embodiments and the present invention can be modified in various ways without departing from the spirit and scope of the invention.

For example, the above showed the configuration wherein the cathode electrode 12 covered the side faces M6 of the semiconductor mesa portion 5 and the surface M3 of the insulating layer 4, but, without having to be limited to this, it is also possible to adopt a configuration wherein the cathode electrode 12 covers the side faces M6 without covering the surface M3, or a configuration wherein the cathode electrode 12 covers neither of the surface M3 and the side faces M6. The above showed the configuration wherein the insulating film 18 was provided on the surface M5 and the side faces M6 of the semiconductor mesa portion 5, the cathode electrode 12 was provided on the insulating film 18 so as to cover it, and the cathode electrode 12 was electrically connected through the contact hole H2 to the $n^+$ type region 14, but, without having to be limited this, it is also possible to adopt a configuration without the insulating film 18 wherein the cathode electrode 12 is provided on the surface M5 and side faces M6 of the semiconductor mesa portion 5 to be electrically connected directly to the $n^+$ type region 14.

The conductivity types of p-type and n-type in the photodiode 1 may be interchanged so as to be reverse to those described above. Namely, a possible configuration is such that the $n^+$ type embedded layer 6 is changed to a $p^+$ type embedded layer, the $n^-$ type layer 8 to a $p^-$ type layer, the $n^+$ type connection region 10 to a $p^+$ type connection region, the $n^+$ type region 14 to a $p^+$ type region, and the $p^+$ type region 16 to an $n^+$ type region.

In the photodiode 1 of the present embodiment the side faces M6 of the semiconductor mesa portion 5 are nearly perpendicular to the surface M3, but the side faces M6 may be arranged so as to be oblique relative to the surface M3.

The $n^+$ type region 14 and $n^+$ type connection region 10, and the $p^+$ type region 16 may be formed by ion implantation, instead of the diffusion.

In the present embodiment, the irregular asperity 22 is formed in the surface 7 of the $n^+$ type embedded layer 6 exposed in the hole H1, but it is not limited to this example. For example, it is also possible to adopt a method of thinning the semiconductor substrate 2 so as to leave a part of the semiconductor substrate 2 during the thinning of the semiconductor substrate 2, and irradiating the left portion of the semiconductor substrate 2 with the pulsed laser beam to form the irregular asperity 22. In this case, it is necessary to form a semiconductor layer with the same conductivity type as the semiconductor substrate 2 and with a high impurity concentration, which functions as an accumulation layer, in the left portion of the semiconductor substrate 2, and therefore the steps and configuration can become complicated. Therefore, it is preferable to form the irregular asperity 22 in the surface 7 of the $n^+$ type embedded layer 6 exposed in the hole H1, as in the present embodiment.

INDUSTRIAL APPLICABILITY

The present invention is applicable to semiconductor photodetection elements and photodetection apparatus.

LIST OF REFERENCE SIGNS 1 photodiode; 2 semiconductor substrate; 2a support substrate; 4, 4a insulating layer; 5 semiconductor mesa portion; 6 $n^+$ type embedded layer; 6a $n^+$ type semiconductor layer; 7 surface of $n^+$ type embedded layer exposed in hole; 8 $n^-$ type layer; 8a $n^-$ type semiconductor substrate; 10 $n^+$ type connection region; 12 cathode electrode; 14 n$^+$ type region; 16 p$^+$ type region; 20 anode electrode; 22 asperity; H1 hole; M1 first principal surface; M2 second principal surface; PL pulsed laser beam; S1 photosensitive region.

The invention claimed is:

1. A photodiode manufacturing method comprising:
   a step of preparing a silicon substrate having a semiconductor substrate having a first principal surface and a second principal surface opposed to each other, an insulating layer provided on the second principal surface of the semiconductor substrate, a first impurity region of a first conductivity type provided on the insulating layer, and a low-concentration impurity region of the first conductivity type provided on the first impurity region and having a lower impurity concentration than the first impurity region;
   a step of forming a photosensitive region including an impurity region of a second conductivity type, in the low-concentration impurity region;
   a step of shaping the first impurity region and the low-concentration impurity region into a mesa shape to form a semiconductor mesa portion including the photosensitive region;
   a step of forming a second impurity region of the first conductivity type having a higher impurity concentration than the low-concentration impurity region, on a surface of the semiconductor mesa portion and forming a third impurity region of the first conductivity type having a higher impurity concentration than the low-concentration impurity region, on a side face of the semiconductor mesa portion, to electrically connect the first impurity region, the second impurity region, and the third impurity region;
   a step of thinning a portion in the semiconductor substrate corresponding to the photosensitive region, from the first principal surface side, while leaving a surrounding region around the thinned portion;
   a step of irradiating the thinned portion of the silicon substrate with a pulsed laser beam from the first principal surface side to form an irregular asperity;
   a step of subjecting the silicon substrate to a thermal treatment, after the step of forming the irregular asperity; and
   a step of, after the step of subjecting the silicon substrate to the thermal treatment, forming a first electrode on the semiconductor mesa portion so as to be electrically connected to the impurity region of the photosensitive region and forming a second electrode on the semiconductor mesa portion so as to be electrically connected to the second impurity region.

2. The photodiode manufacturing method according to claim 1, wherein the step of forming the irregular asperity comprises irradiation with a picosecond to femtosecond pulsed laser beam as the pulsed laser beam.

3. The photodiode manufacturing method according to claim 1, wherein the insulating layer is comprised of silicon oxide, and
   wherein the step of thinning comprises etching the semiconductor substrate from the first principal surface side, using the insulating layer as an etching stop layer.

4. The photodiode manufacturing method according to claim 1, wherein a thickness of the first impurity region is set to be larger than a height difference of the irregular asperity.

5. A photodiode comprising:
   a silicon substrate portion having a semiconductor substrate having a first principal surface and a second principal surface opposed to each other, an insulating layer provided on the second principal surface of the semiconductor substrate, and a semiconductor mesa portion provided on the insulating layer and having a principal surface formed opposite to a joint surface to the insulating layer; and
   a first electrode and a second electrode provided on the principal surface of the semiconductor mesa portion,
   wherein the semiconductor mesa portion comprises:
   a first impurity region of a first conductivity type provided on the joint surface to the insulating layer;
   a low-concentration impurity region of the first conductivity type provided on the first impurity region and having a lower impurity concentration than the first impurity region;
   a photosensitive region provided in the low-concentration impurity region and including an impurity region of a second conductivity type;
   a second impurity region of the first conductivity type provided on the principal surface of the semiconductor mesa portion in the low-concentration impurity region and having a higher impurity concentration than the low-concentration impurity region; and
   a third impurity region of the first conductivity type provided on a side face of the semiconductor mesa portion in the low-concentration impurity region and having a higher impurity concentration than the low-concentration impurity region,
   wherein in the silicon substrate portion, a portion corresponding to the photosensitive region is thinned from the semiconductor substrate side while leaving a surrounding region around the thinned portion,
   wherein an irregular asperity is formed in a surface opposed to the principal surface of the semiconductor mesa portion in the thinned portion of the silicon substrate portion and the surface is optically exposed,
   wherein the third impurity region is electrically connected to the first impurity region and the second impurity region, and
   wherein the first electrode is electrically connected to the impurity region of the photosensitive region and the second electrode is electrically connected to the second impurity region.

6. The photodiode according to claim 5, wherein the irregular asperity is formed in the first impurity region and the first impurity region is optically exposed.

7. The photodiode according to claim 5, wherein a thickness of the first impurity region is larger than a height difference of the irregular asperity.

* * * * *